United States Patent [19]

Harroun et al.

[11] 4,288,864
[45] Sep. 8, 1981

[54] SERIAL-PARALLEL-SERIAL CCD MEMORY SYSTEM WITH FAN OUT AND FAN IN CIRCUITS

[75] Inventors: Thomas V. Harroun, Essex Junction; Lawrence G. Heller, South Burlington; Norbert G. Vogl, Jr., Colchester, all of Vt.

[73] Assignee: International Business Machines Corporation, Armonk, N.Y.

[21] Appl. No.: 87,843

[22] Filed: Oct. 24, 1979

[51] Int. Cl.³ .................. G11C 11/40; G11C 19/28
[52] U.S. Cl. .................................. 365/219; 357/24; 365/183; 365/238
[58] Field of Search ............ 365/183, 219, 238; 357/24

[56] References Cited

U.S. PATENT DOCUMENTS

| | | | |
|---|---|---|---|
| 3,889,245 | 6/1975 | Gosney | 365/183 |
| 3,902,186 | 8/1975 | Engeler et al. | 357/24 |
| 3,913,077 | 10/1975 | Erb | 365/238 |
| 3,967,254 | 6/1976 | Kosonocky et al. | 365/183 |
| 4,024,514 | 5/1977 | Elmer et al. | 357/24 |
| 4,028,671 | 6/1977 | Leach | 365/183 |
| 4,117,546 | 9/1978 | Anantha et al. | 365/183 |
| 4,199,691 | 4/1980 | Angle | 365/183 |
| 4,211,936 | 7/1980 | Kosonocky et al. | 365/221 D |

OTHER PUBLICATIONS

Altman, "Charge-Coupled Devices Move on Memories and Analog Signal Processing", *Electronics,* 8/8/74, pp. 91–101.

Kohyama et al, "A New Multiplexed Electrode-Per-Bit Structure for a 64-K Bit Charge-Coupled-Device Memory", IEEE Jour. No. 4, Solid-State Cir. 8/77, vol. SC-12, pp. 335–343.

*Primary Examiner*—Stuart N. Hecker
*Attorney, Agent, or Firm*—Stephen J. Limanek

[57] ABSTRACT

An SPS CCD memory system is provided wherein a single tap, preferably a storage node, on an input serial or shift register is connected to the input of a plurality of parallel shift registers through a fan out circuit and the output of the plurality of parallel shift registers is connected to a single tap, preferably a storage node, on an output serial or shift register through a fan in circuit.

9 Claims, 9 Drawing Figures

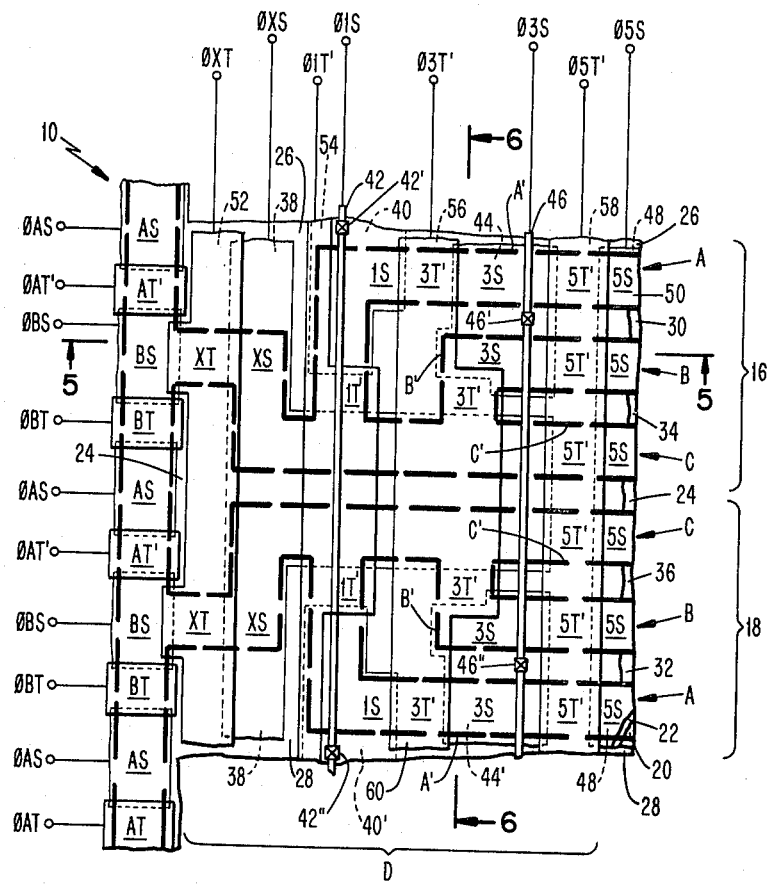
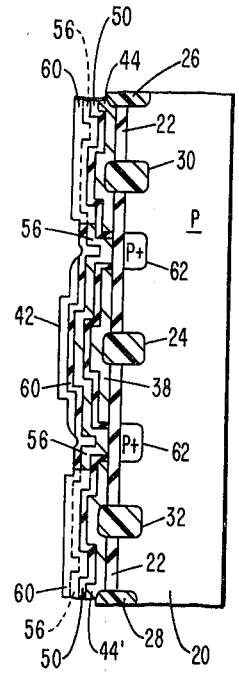
FIG. 4
FIG. 6
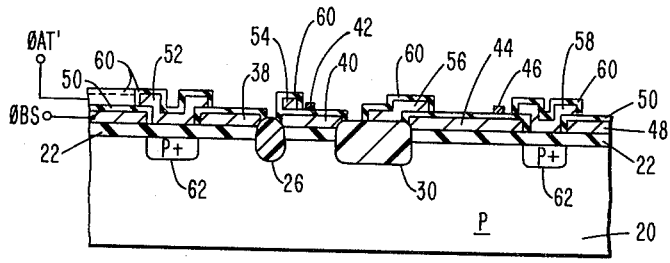
FIG. 5

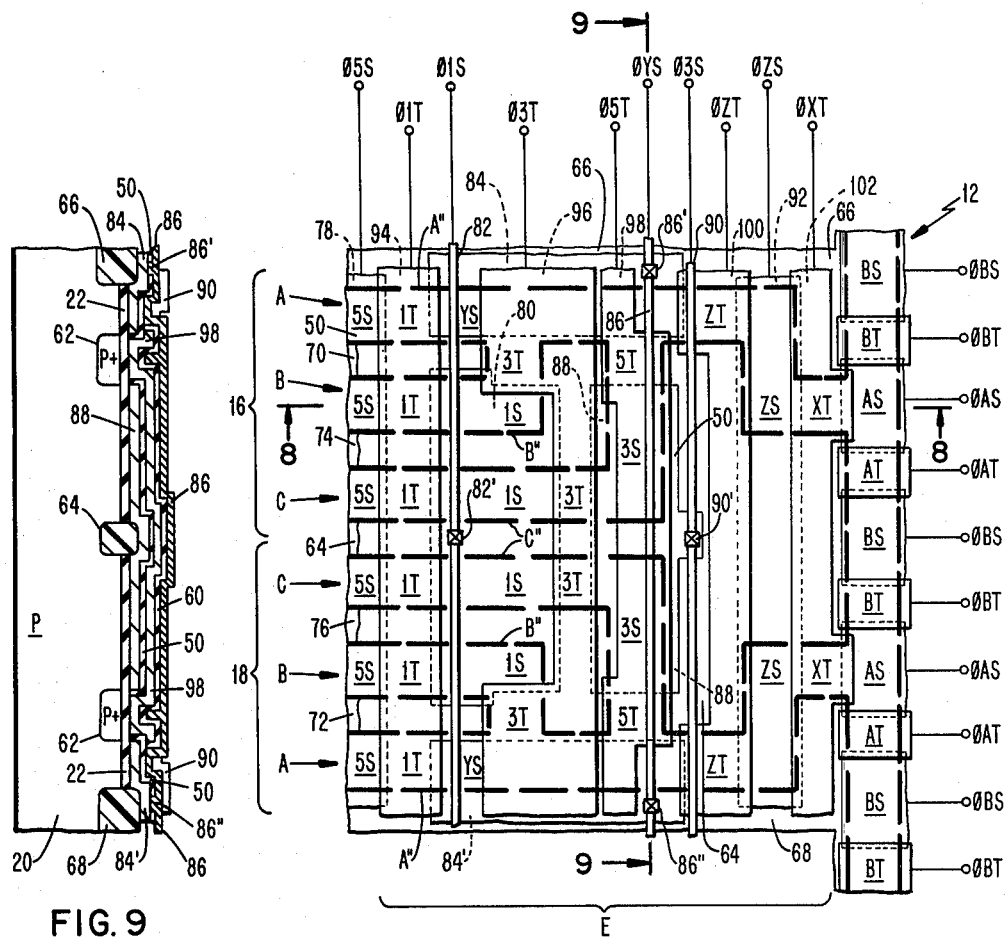
FIG. 9
FIG. 7
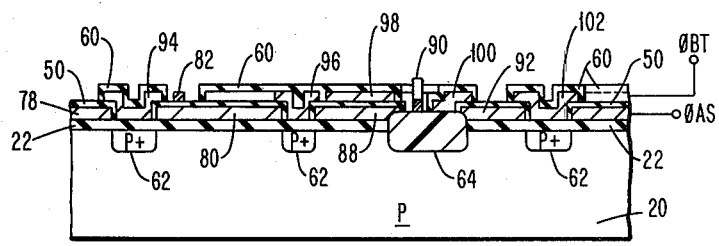
FIG. 8

SERIAL-PARALLEL-SERIAL CCD MEMORY SYSTEM WITH FAN OUT AND FAN IN CIRCUITS

DESCRIPTION

TECHNICAL FIELD

This invention relates to integrated semiconductor circuits and more particularly to a charge coupled device (CCD) memory of the serial-parallel-serial (SPS) type including a serial register input section, a serial register output section and a main storage section having a plurality of parallelly arranged serial registers or channels coupling the serial input section to the serial output section. Each of the serial registers in each of the sections forms a channel through which packets of charge, e.g., electrons, are propagated under the control of clock pulses applied to a series of electrodes of alternately disposed transfer gates and storage needs. SPS CCD memories are used to store large quantities of data bits of information at low cost.

BACKGROUND ART

In U.S. Pat. No. 4,024,514, filed June 30, 1975, there is disclosed an SPS CCD memory wherein the serial input and output sections each has approximately twice the number of storage nodes as the number of channels contained in the main parallel storage section with data bits being transferred into and out of each of the channels of the main parallel storage section in one step.

U.S. Pat. No. 3,913,077, filed Apr. 17, 1974, describes an SPS CCD memory arranged in an interlaced or interleaved mode wherein data bits are alternately stored at even and odd storage nodes of the serial input and output sections with the data bits being transferred into and out of the main parallel storage section in two steps so that each storage node of the serial input and output sections serves one channel of the main parallel storage section.

U.S. Pat. No. 3,967,254, filed Nov. 18, 1974, illustrates an output gate electrode structure for transferring data bits from the main parallel storage section to the serial output section which may be used in an SPS CCD memory arranged in an interlaced or interleaved mode.

In commonly assigned U.S. Pat. No. 4,117,546, filed Dec. 30, 1977, there is disclosed an interlaced SPS CCD memory which uses a low number of different clock pulses to propagate the packets of charge through the channels.

It can be noted that in each of the SPS CCD memories or SPS charge transfer device (CTD) memories disclosed in the above identified patents at least one storage node and an associated transfer gate is provided in the serial input and output sections for each data bit channel contained in the main parallel storage section. Accordingly, the packing density of the channels in the main parallel storage section of the SPS CCD memory is not optimum since in known CCD technologies or processes the minimum combined length L of an electrode of a storage node and an electrode of an associated transfer gate is substantially longer than the minimum combined width W of a channel and a channel isolation medium or channel stop region required between adjacent parallel channels, i.e., L>W. Stated in another way, the pitch of the input and output series registers limits the storage node or cell density in the main parallel storage section of the SPS CCD memories.

DISCLOSURE OF INVENTION

It is an object of this invention to provide an improved SPS CCD memory having a high density of storage nodes for data bits.

It is another object of this invention to provide an improved SPS CCD memory which is simple and inexpensive to manufacture.

It is still another object of this invention to provide an improved SPS CCD memory which is very flexible and, therefore, can be used with many CCD technologies or processes to provide memories having a high density of storage nodes for data bits.

It is yet another object of this invention to provide an improved SPS CCD memory wherein more than one channel of the main parallel storage section is provided for one storage node and its associated transfer gate of a serial section.

In accordance with the teachings of this invention, an SPS CCD memory system is provided wherein a tap on the serial input section is connected to a fan out circuit coupled to a plurality of channels contained in the main parallel storage section and an output from each of the plurality of channels in the main parallel storage section is connected to a fan in circuit having an output connected to a given tap on the serial output section.

In one embodiment of the invention, the SPS CCD memory has a serial input section or input series register having two storage nodes and associated transfer gates, a serial output section or output series register having two storage nodes and associated transfer gates and a main parallel storage section or main parallel registers having three series or shift registers. A fan out circuit is coupled at its input to one of the two storage nodes, sites or cells of the input series register and at its output to the input ends of the three series registers. A fan in circuit is coupled at its input to the output end of each of the three series registers and at its output to one of the two storage nodes, sites or cells of the output series register. By utilizing this arrangement, the three channels formed in the main parallel storage section and the required channel isolation medium, each made of minimum width, are disposed within the combined length of the two storage nodes and transfer gates to provide a very dense array which can be produced by a a simple and inexpensive CCD process.

The foregoing and other objects, features and advantages of the invention will be apparent from the following and more particular description of the preferred embodiments of the invention, as illustrated in the accompanying drawings.

BRIEF DESCRIPTION OF THE DRAWINGS

FIG. 4 is a plan view of a fan out circuit which may be used in the SPS CCD memory system of the present invention;

FIG. 5 is a sectional view of the fan out circuit of FIG. 4 taken through line 5—5 thereof;

FIG. 6 is a sectional view of the fan out circuit of FIG. 4 taken through line 6—6 thereof;

FIG. 7 is a plan view of a fan in circuit which may be used in the SPS CCD memory system of the present invention;

FIG. 8 is a sectional view of the fan in circuit of FIG. 7 taken through line 8—8 thereof; and FIG. 9 is a sectional view of the fan in circuit of FIG. 7 taken through line 9—9 thereof.

BEST MODE FOR CARRYING OUT THE INVENTION

Figure 1:
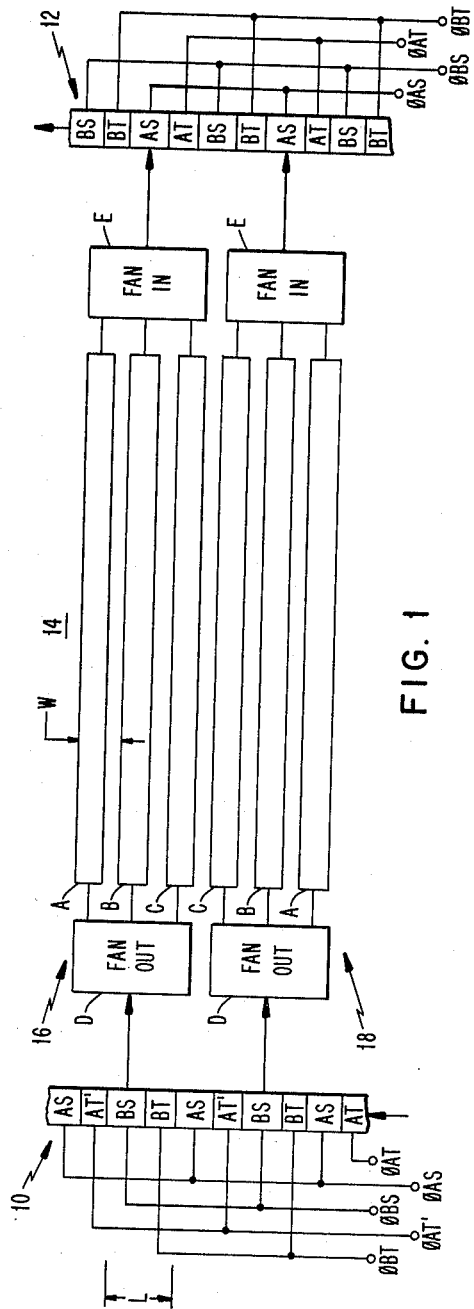
FIG. 1 is generally a block diagram illustrating the SPS CCD memory system of the present invention.

Referring to FIG. 1 of the drawing in more detail, there is illustrated an embodiment of the SPS CCD memory system of the present invention which includes a serial input section or input series register 10, a serial output section or output series register 12 and a main parallel storage section or main parallel registers 14. The main parallel storage section 14 includes first and second subsets 16 and 18 of the main parallel storage section 14. Each of the first and second subsets 16 and 18 includes three data bit parallel channels A, B and C having an input end connected to a fan out circuit D and an output end connected to a fan in circuit E, with the input of the fan out circuit D being coupled to the serial input section 10 and the output of the fan in circuit E being coupled the serial output section 12. As is known, the serial input and output sections 10 and 12 include a first plurality of storage nodes, cells or sites indicated as AS which may be controlled by a clock pulse $\phi AS$ and a second plurality of storage nodes, cells or sites indicated as BS and controlled by a clock pulse indicated as $\phi BS$. Disposed between adjacent storage nodes AS and BS are transfer gates indicated as AT, AT' and BT which are controlled by pulses $\phi AT$, $\phi AT'$ and $\phi BT$, respectively, to form a two phased synchronized clocking system for the serial input and output sections 10 and 12.

It should be noted that when using known processes for making the SPS CCD memory the combined length L of a storage node or electrode such as BS and the transfer gate such as BT is longer than the combined width W of a data bit channel, such as channel A, and an insulating medium or channel stop region required between adjacent channels, such as between channels A and B. Although only first and second subsets 16 and 18 are illustrated in FIG. 1 of the drawing, it should be understood that in practice many more subsets would be provided for storing data bit information received from the serial input section 10 and transferred to the serial output section 12. Accordingly, it can be seen that in the SPS CCD memory illustrated in FIG. 1 of the drawing the main storage section for storing data bits is in the parallel storage section 14.

In order to provide a high density of storage nodes in the SPS CCD memory, it is, therefore, necessary that the parallel channels such as A, B and C have a minimum width and a minimum spacing therebetween. Since the minimum combined width W of a data bit channel, such as channel A, and the necessary isolation medium or channel stop region is less than the combined length L of a storage node and its associated transfer gate in the serial input and output sections 10 and 12, a fan out circuit and a fan in circuit are provided for each of the subsets 16 and 18 to produce maximum storage node packing density in the main parallel storage section 14. The arrangement of the fan out circuits D and fan in circuits E is indicated in some detail in the FIG. 2 of the drawing.

Figure 2:
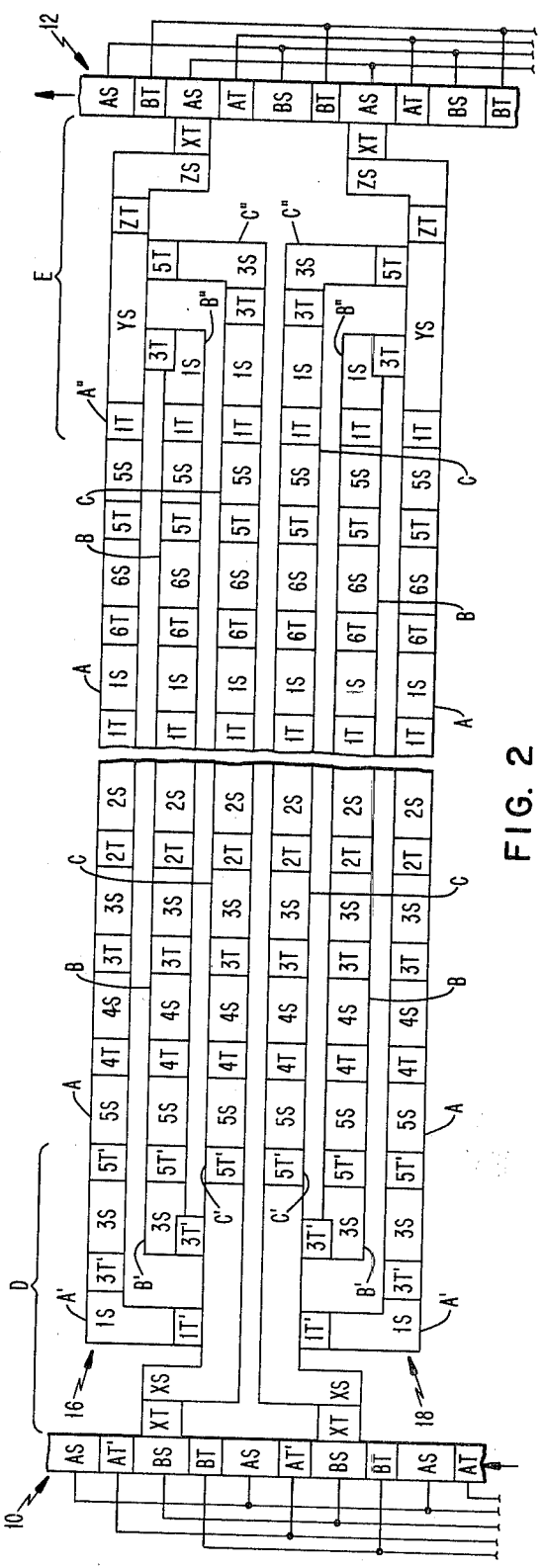
FIG. 2 is a more detailed illustration of the SPS CCD memory system shown in FIG. 1 indicating transfer gates and storage nodes throughout the memory system.

For purposes of the description, the storage nodes and transfer gates such as those indicated at BS and BT of the serial input and output sections in FIGS. 1 and 2 of the drawing are referred to by reference characters related to the particular clock pulses to which they are connected, as will be indicated more clearly hereinbelow. As can be seen in FIG. 2 of the drawing, the storage node BS is coupled to a storage node XS of the fan out circuit D through a transfer gate XT. Storage node XS is coupled to storage node 1S of channel A' of fan out circuit D through transfer gate 1T', with storage node 1S being coupled to storage node 3S of channel A' through transfer gate 3T'. The output from channel A' is coupled to the input of channel A of the parallel channels at storage node 5S through transfer gate 5T'. Storage node XS is also coupled to storage node 3S of channel B' in fan out circuit D through transfer gate 3T'. The output of channel B' of fan out circuit D is coupled to the input of channel B at storage node 5S through transfer gate 5T'. Storage node XS is furthermore coupled to the input of channel C through channel C' via transfer gate 5T'.

The parallel channels A, B and C are shown in a multiphase or n phase clocking system having six different clock pulses for the storage nodes 1S, 2S, 3S, 4S, 5S and 6S and six different clock pulses for the transfer gates 1T, 2T, 3T, 4T, 5T and 6T, as is well known for a six phase clocking system.

The output from channel A at storage node 5S of the parallel channnels is applied to a large storage node YS in the fan in circuit E through channel A" including transfer gate 1T. Since storage node YS has a considerably larger area than that of the storage nodes in the serial output section 12, such as storage node AS, in order to improve the transfer efficiency between storage node YS of the fan in circuit E and the storage node AS of the serial output section 12, an interface node ZS having an area or size more compatible with that of storage node AS of serial output section 12 is inserted between storage node YS and storage node AS. Storage node YS is coupled to the interface storage node ZS through transfer gate ZT and interface storage node ZS is coupled to the storage node AS in serial output section 12 through transfer gate XT. The output of channel B of the parallel channels at storage node 5S is coupled to storage node 1S in channel B" of fan in circuit E through transfer gate 1T and the storage node 1S of channel B" is connected to the large storage node YS through transfer gate 3T. The output from channel C of the parallel channels at storage node 5S is coupled to storage node 1S in channel C" of fan in circuit E through transfer gate 1T and storage node 1S of channel C" is coupled to storage node 3S through gate electrode 3T, with storage node 3S of channel C" being coupled to the large storage node YS through transfer gate 5T.

It should be noted that for ease of layout adjacent subsets such as subsets 16 and 18 are arranged to form the mirror image of each other along a horizontal axis running between subset 16 and subset 18. It should also be noted that although only one series of storage nodes 1S, 2S, 3S, 4S, 5S and 6S and transfer gates 1T, 2T, 3T, 4T, 5T and 6T in the parallel channels have been illustrated in FIG. 2 of the drawing, many more such series may be provided in each of the channels A, B and C so as to produce channels with each having, for example, 256 storage nodes.

Figure 3:
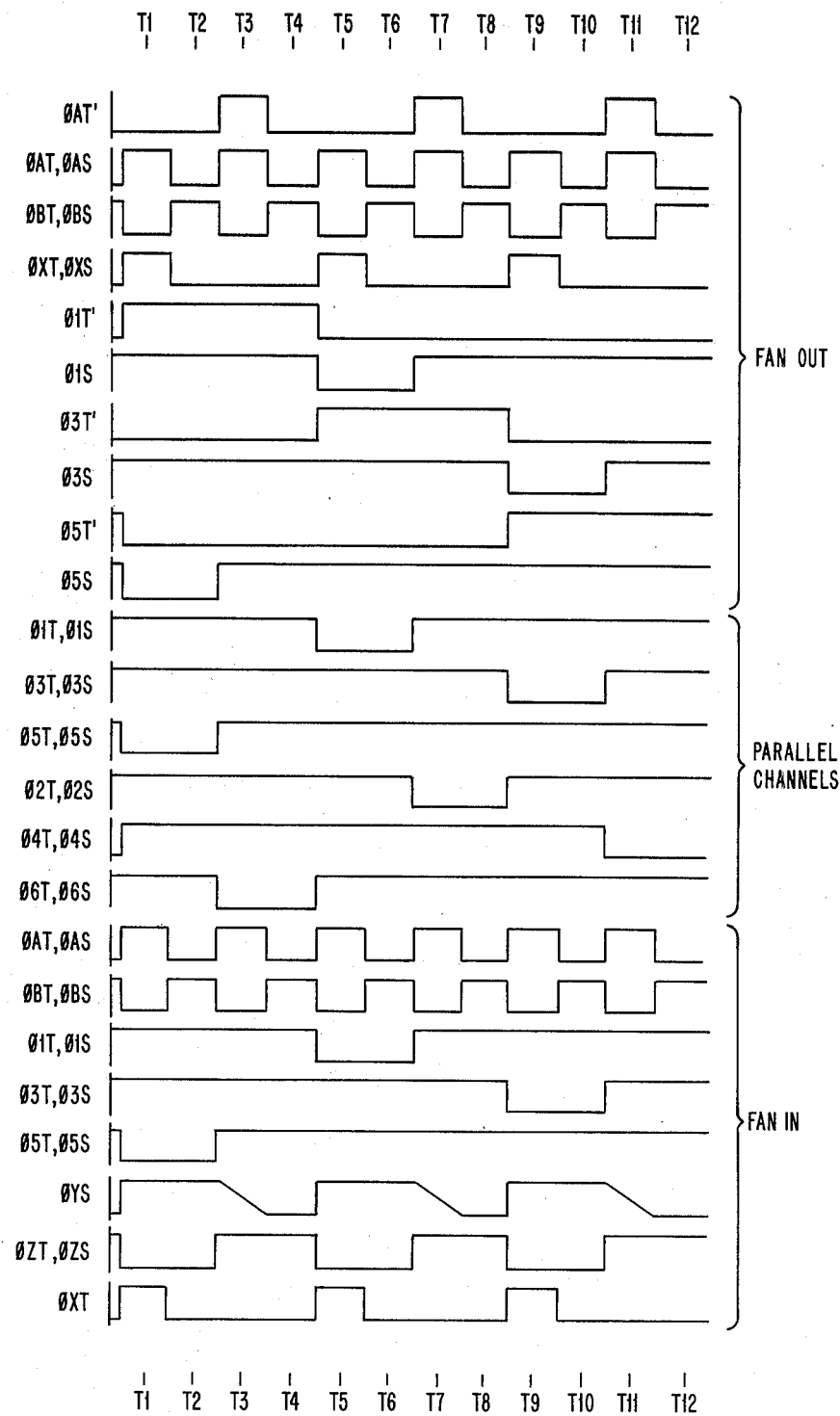
FIG. 3 is a pulse program which may be used to operate the memory system illustrated in FIGS. 1 and 2.

In FIG. 3 of the drawings, there is indicated a pulse program which may be used to operate the memory illustrated in FIGS. 1 and 2 of the drawings. It can be seen that information in the form of packets of charge are introduced at the lower end of the serial input section 10 in FIG. 2 of the drawing and propagated through the serial input section 10 upwardly under the control of clock pulses $\phi AT'$, $\phi AT$, $\phi AS$, and $\phi BT$, $\phi BS$, indicated in the fan out portion of FIG. 3 of the drawing, in a known manner for a two phase clocking system. Assuming that a packet of charge representing, e.g., a binary digit 1 is stored in each of the two storage nodes BS of input section 10, positive pulses $\phi XT$, $\phi XS$, $\phi 1T'$ and $\phi 1S$ during periods t1 and t2 transfer the storage charge from storage node BS to storage node 1S of fan out circuit D. During time periods t1, t2, t3 and t4 two more data bits, represented by charge or no charge, are transferred through input section 10 to the two storage nodes BS. In time periods t5 and t6, clock pulses $\phi XT$, $\phi XS$, $\phi 3T'$ and $\phi 3S$ transfer the data bit information from storage nodes BS to storage nodes 3S in channel B' of fan out circuit D, while clock pulses $\phi 3T'$ and $\phi 3S$ transfer the charge from storage node 1S to storage node 3S of channel A'. During time periods t5, t6, t7, and t8 two more data bits are transferred through input section 10 to the two storage nodes BS. In time periods t9 and t10, clock pulses $\phi XT$, $\phi XS$, $\phi 5T'$ and $\phi 5S$ transfer the data bit information from storage nodes BS to storage node 5S in channel C of the parallel channels, while clock pulses $\phi 5T'$ and $\phi 5S$ transfer charge from storage node 3S in channel B' of fan out circuit D to storage node 5S in channel B of the parallel channels and from storage node 3S in channel A' of fan out circuit D to storage node 5S in channel A of the parallel channels. In this manner, all three channels A, B and C of the first and second subsets 16 and 18 receive data simultaneously at their input ends, i.e., at storage nodes 5S. It should be noted that since only two subsets 16 and 18 are illustrated only one consecutive positive pulse $\phi AT'$, such as at time t3 is required. When more subsets are used then more consecutive positive pulses $\phi AT'$ are needed. During time periods t9, t10, t11 and t12 two more data bits are transferred through the input section 10 to the storage nodes BS to begin another cycle which will again propagate information into storage nodes 5S at each of the parallel channels but only after the previous information stored in storage nodes 5S is transferred to storage nodes 4S through transfer gates 4T and then to subsequent storage nodes of the parallel channels under the control of clock pulses $\phi 1T$, $\phi 1S$, $\phi 2T$, $\phi 2S$, $\phi 3T$, $\phi 3S$, $\phi 4T$, $\phi 4S$, $\phi 5T$, $\phi 5S$, $\phi 6T$ and $\phi 6S$ in the manner to be described hereinbelow in more detail.

Referring more particularly to the pulses indicated in the parallel channels portion of FIG. 3 of the drawings, it can be seen that during time t1 information stored in storage nodes 5S of channels A, B and C is transferred to storage nodes 4S through transfer gate 4T with clock pulse $\phi 4T$, $\phi 4S$ being positive and clock pulse $\phi 5T$, $\phi 5S$ being reduced to zero volts. This information is stored in storage nodes 4S for 10 time periods, until time t11, when clock pulse $\phi 4S$ is reduced to zero volts and clock pulse $\phi 3T$, $\phi 3S$ becomes positive. Storage nodes 3S retain the information for another 10 time periods, until time t8 of the next cycle, when clock pulse $\phi 3S$ is reduced to zero volts and clock pulse $\phi 2T$, $\phi 2S$ becomes positive. In like manner, the information is transferred from storage node 2S to storage node 1S at time t6 of the subsequent cycle, from storage node 1S to storage node 6S at time t4 of another cycle and finally from storage node 6S to storage node 5S at time t3 to complete the transfer of information through all six phases of the six phase clocking system of the parallel channels. It should be understood that these six phases may be repeated many times in the parallel channels A, B and C before the information is transferred from the output storage nodes 5S into the fan in circuit E. It should also be understood that the information may be transferred from storage nodes 1S or 3S, if desired, into the fan in circuit E.

Referring more particularly to the pulses indicated in the fan in portion of FIG. 3 of the drawings, it can be seen that information is transferred from each of the output storage nodes 5S of the parallel channels A, B and C by the known push clock concept simultaneously during time period t1 when clock pulse $\phi 5S$ is lowered to zero volts and the clock pulse $\phi 1T$, $\phi 1S$ is transfer gates 1T and storage nodes 1S and the control pulse $\phi YS$ at storage node YS of the fan in circuit E are positive. Due to the large size of storage node YS, the information stored therein is transferred to storage node ZS during time period t3 with the use of the clock pulse $\phi YS$ having a sloping trailing edge and control pulse $\phi ZT$, $\phi ZS$ being positive. At time t5 the information in storage node ZS is transferred through transfer gate XT of fan in circuit E to storage node AS of the serial output section 12 with the clock pulse $\phi ZS$ being reduced to zero volts and the clock pulse $\phi XT$ and $\phi AS$ being positive. Also at time t5, information stored in storage node 1S of channel B" and in storage node 1S of channel C" is transferred to storage nodes YS and 3S, respectively, of circuit E. At time t7 information is again transferred from storage node YS to ZS and at time t9 information stored in storage node 3S of channel C" is transferred to storage node YS while information in storage node ZS is being transferred to storage node AS of the serial output section. At time t11 the information from channel C" which is now located in storage node YS is transferred to storage node ZS. With the beginning of the next cycle, i.e., at time t1, the information in storage node ZS is transferred into storage node AS of serial output section 12 as new information is introduced into the inputs, through transfer gates 1T, of fan in circuit E.

After information is introduced into the serial output section 12 through storage nodes AS it is propagated upwardly to the output end of section 12 in a two phase clocking system utilizing clock pulses $\phi AT$, $\phi AS$ and $\phi BT$, $\phi BS$, as indicated in the fan in portion of FIG. 3 of the drawing, in a manner similar to that disclosed in connection with the propagation of information through serial input section 10.

The information from the output of the serial output section 12 may be applied to any suitable utilization circuit or, if desired, it may be recirculated through the SPS CCD memory by coupling the output of the serial output section 12 to the input of the serial input section 10 through known suitable circuitry.

In FIGS. 4, 5, 6, 7, 8 and 9 of the drawings there is illustrated sections of the SPS CCD memory in more detail. FIGS. 4, 5 and 6 show the fan out sections 16 and 18 along with the serial input section 10, with FIG. 4 illustrating a plan view and FIGS. 5 and 6 being sectional views taken through FIG. 4 at lines 5—5 and 6—6, respectively.

The SPS CCD memory system of the present invention has a semiconductor substrate 20, preferably made of P type silicon, on which there is disposed a thin insulating layer 22 which is preferably made of silicon dixode. The channels carrying the data bits are illustrated in FIG. 4 of the drawing by bold dashed lines and generally take the form indicated in FIG. 2 of the drawing. Fan out circuit D of subset 16 is separated from fan out circuit D of subset 18 by an isolation medium or channel stop region which may be made in the form of a recessed oxide segment 24. Fan out circuit D of subset 16 is also isolated from other fan out circuits, not shown, by recessed oxide segment 26 and fan out circuit D of subset 18 is separated from other fan out circuits, not shown, by recessed oxide segment 28. Channel A' of fan out circuit D of subset 16 and channel A of the parallel channels are separated from channel B' of fan out circuit D of subset 16 and its associated channel B in the parallel channels by recessed oxide segments 30. Channel A' of fan out circuit D of subset 18 and its associated channel A of the parallel channels are separated from channel B' of fan out circuit D of subset 18 and its associated channel B by recessed oxide segment 32. Channel B' of fan out circuit D of subset 16 and its associated channel B of the parallel channels are separated from channel C' of fan out circuit D of subset 16 and its associated channel C in the parallel channels by recessed oxide segment 34. Channel B' of fan out circuit D of subset 18 and its associated channel B in the parallel channels are separated from channel C' of fan out circuit D of subset 18 and its associated channel C in the parallel channels by recessed oxide segment 36.

The electrodes required to propagate and to maintain the packets of charge in the channels are made preferably of doped polysilicon. A first layer of doped polysilicon is deposited on the thin insulating layer 22 and etched in a known manner into the required segments to form storage nodes, such as AS and BS in the serial input section 10, as well as storage nodes XS, 1S and 3S in the fan out circuits D. As illustrated in the serial input section 10 in FIG. 4, clock pulses $\phi AS$ and $\phi BS$ are shown connected to polysilicon segments AS and BS, respectively. Referring in more detail to the fan out circuits D of subsets 16 and 18, a polysilicon segment 38 to which clock pulse $\phi XS$ is connected is used as the electrode for storage node XS in the fan out circuits D of subsets 16 and 18. Polysilicon segment 40 is provided for storage node 1S in channel A' of the fan out circuit D of subset 16 and polysilicon segment 40' is provided for storage node 1S in channel A' of fan out circuit D of subset 18. Segments 40 and 40' are connected through a conductive strap 42 to clock pulse $\phi 1S$ via contacts 42' and 42", respectively. Polysilicon segment 44 is provided for storage nodes 3S in channels A' and B' of fan out circuit D of subset 16 and polysilicon segment 44' is provided for storage nodes 3S in channels A' and B' of fan out circuit D of subset 18. Polysilicon segments 44 and 44' are connected through conductive strap 46 to clock pulse $\phi 3S$ via contacts 46' and 46". Polysilicon segment 48, to which clock pulse $\phi 5S$ is connected, is provided for storage nodes 5S of each channel of the parallel channels. All other storage nodes in the parallel channels also have their electrodes made from the first layer of polysilicon in a known manner.

All electrodes for the transfer gates of the SPS CCD memory are made from a second layer of polysilicon after the segments of the first layer of polysilicon have been appropriately oxidized to form a layer of insulation as indicated at 50.

The second layer of polysilicon is deposited to provide electrodes for the transfer gates, such as transfer gates AT, AT' and BT of the serial input section 10 and for the transfer gates XT, 1T', 3T' and 5T' of the fan out circuits D of subsets 16 and 18. Clock pulses $\phi AT$, $\phi AT'$ and $\phi BT$ are indicated as being connected to segments of the second polysilicon layer at transfer gates AT, AT' and BT, respectively, of the serial input section 10. Referring in more detail to the fan out circuits D of subset 16 and 18 polysilicon segment 52, connected to clock pulse $\phi XT$, is provided for transfer gates XT in both fan out circuits D of subsets 16 and 18. Polysilicon segment 54, connected to clock pulse $\phi 1T'$, is provided for transfer gate 1T' in channel A' of both fan out circuits D of subsets 16 and 18. Polysilicon segment 56, connected to clock pulse $\phi 3T'$, is provided for transfer gates 3T' in channels A' and B' of both fan out circuits D of subsets 16 and 18. Polysilicon segment 58, connected to clock pulse $\phi 5T'$, is provided for transfer gates 5T' in channels A', B' and C' at each of the outputs from fan out circuits D of subsets 16 and 18. A suitable passivating layer such as a layer of silicon dioxide 60 covers each of the segments formed from the second layer of polysilicon.

It should be noted that all of the pulses illustrated in FIG. 3 of the drawing have the same magnitude, which may be, e.g., 5 to 8.5 volts, regardless of whether they are used for the transfer gates or for the storage nodes. Since clock pulses of the same amplitude are used for both the transfer gates and the storage nodes, means must be provided to make the potential well formed under the transfer gate shallower than the potential well formed under the storage nodes in order to provide directionality for packets of charge moving through the channel. In the embodiment disclosed hereinabove a P+ diffusion region 62 is formed in the P type substrate 20 to provide a shallower potential well under the transfer gates as compared with the potential well under the storage nodes. As can be seen in FIG. 5 of the drawing, a P+ region 62 is formed in transfer gate XT under segment 52 and in transfer gate 5T' under segment 58. Also as seen in FIG. 6 of the drawing, a P+ region 62 is provided in transfer gates 3T' of channel B' under segment 56. As is well known, the P+ region 62 may be formed in substrate 20 by either diffusion or ion implantation techniques during the early stages of the fabrication of the memory. It should also be known that, if desired, other techniques may be employed, such as by the use of the well known stepped oxide technique, to provide shallower wells in the transfer gates. If desired, transfer gate clock pulses may be produced having a magnitude substantially smaller than that of the storage node clock pulses, without employing the P+ regions or the stepped oxide technique.

FIG. 7 is a plan view of the fan in circuits E of subsets 16 and 18 and the serial output section 12 illustrating aspects of the invention in more detail, along with FIGS. 8 and 9 which are sectional views of FIG. 7 taken along the lines 8—8 and 9—9 thereof, respectively. All data bit channels are identified by bold dashed lines. Channels C" of the fan in circuit E of subsets 16 and 18 are separated from each other by a recessed oxide segment 64. A recessed oxide segment 66 isolates the other side of fan in circuit E of subset 16 from the channels of fan in circuits E of adjacent subsets, not shown, and recessed oxide 68 isolates the other side of fan in circuit E of subset 18 from the channels of other fan in circuits E of adjacent subsets, not shown. Channel A of the parallel channels and channel A" of the fan in circuit E of subset 16 are separated from channel B of the parallel channels and from channel B" of fan in circuit E of subset 16 by recessed oxide segment 70. Channel A" of subset 18 and its associated channel A in the parallel channels are separated from channel B" of subset 18 and from its associated channel B in the parallel channels by a recessed oxide segment 72. Channel B" of subset 16 and its associated channel B of the parallel channels are separated from channel C" of subset 16 and its associated channel C of the parallel channels by a recessed oxide segment 74. Channel B" of subset 18 and its associated channel B of the parallel channels are separated from channel C" of subset 18 and its associated channel C of the parallel channels by a recessed oxide segment 76.

As stated hereinabove the electrodes for the storage nodes of the memory are formed from the first layer of polysilicon. Polysilicon segment 78, connected to clock pulse $\phi 5S$ is provided for storage nodes 5S at the output of channels A, B and C of the parallel channels. Polysilicon segment 80, connected to clock pulse $\phi 1S$ through a conductive strap 82 via contact 82', is provided for storage node 1S in channels B" and C" of subsets 16 and 18. Polysilicon segment 84, connected to clock pulse $\phi YS$ through conductive strap 86 via contact 86', is provided for storage node YS in subset 16, and polysilicon segment 84', connected also to clock pulse $\phi YS$ through conductive strap 86 but via contact 86", is provided for storage node YS in subset 18. Polysilicon segment 88, connected to clock pulse $\phi 3S$ through conductive strap 90 via contact 90', is provided for storage node 3S of subset 16 and of subset 18. Polysilicon segment 92, connected to clock pulse $\phi ZS$, is provided for storage nodes ZS of subset 16 and of subset 18. Also formed from the first layer of polysilicon are the storage nodes AS and BS of the serial output section 12 to which clock pulses $\phi AS$ and $\phi BS$ are connected, respectively, as indicated in FIG. 7 of the drawing. After all storage node segments have been formed from the first layer of polysilicon, the segments are preferably oxidized to form the insulation layer 50, as stated hereinabove.

Again as set forth hereinabove, the second layer of polysilicon is deposited to form electrodes for the transfer gates. Polysilicon segment 94, connected to clock pulse $\phi 1T$, is provided for transfer gates 1T at the input to channels A", B" and C" in fan in circuits E of subsets 16 and 18. Polysilicon segment 96, connected to clock pulse $\phi 3T$, is provided for transfer gates 3T in channels B" and C" in the fan in circuits E of subsets 16 and 18. Polysilicon segment 98, connected to clock pulse $\phi 5T$, is provided for transfer gates 5T of the fan in circuit E of subsets 16 and 18. Polysilicon segment 100, connected to clock pulse $\phi ZT$, is provided for transfer gate ZT in subsets 16 and 18. Polysilicon gate 102, connected to clock pulse $\phi XT$, is provided for transfer gate XT of subsets 16 and 18. Electrodes from the second layer of polysilicon are also provided for transfer gates AT and BT in the serial output section 12 which are connected to clock pulses $\phi AT$ and $\phi BT$, respectively. After all transfer gate segments have been formed from the second layer of polysilicon, the segments are preferably oxidized to form the silicon dioxide or insulation layer 60.

As also stated hereinabove, in order to provide directionality for the data bits propagated through the channels, P+ regions 62 are provided at the transfer gates in the fan in circuits as well as in the serial output section 12.

It should be noted that the SPS CCD memory system of this invention is simply fabricated by using only two layers of polysilicon and a few easily applied conductive straps.

It should also be noted that the storage nodes 1S and 3S in the fan out circuits D illustrated in FIGS. 4, 5 and 6 of the drawings and in the fan in circuits E illustrated in FIGS. 7, 8 and 9 of the drawings are not required and are used primarily for convenience in the layout. For example, the data bits in storage node XS of FIGS. 2 or 4 may be transferred directly to the input storage nodes 5S of the parallel channels under the control of clock pulses applied to transfer gates 1T', 3T', and 5T'. Also, in the fan in circuit shown in FIGS. 2 or 7, the data bits stored at the output storage nodes 5S of the parallel sections may be transferred to the large storage node YS under the control of clock pulses applied to transfer gates 1T, 3T, and 5T, but the information must be retained in storage nodes 5S for a sufficient time to permit all information from the storage nodes 5S to be transferred sequentially through storage node YS. Futhermore, since storage node ZS is used only as an interface to more efficiently transfer charge from storage node YS to storage node AS in the serial output section 12, storage node ZS may also be eliminated, if desired.

Each of the subsets 16 and 18 have been illustrated to contain three data bit channels, however, it should be understood that, if desired, only two channels need be provided in each subset, or alternatively, if desired, more than three channels may be used in each subset.

To more clearly appreciate the versatility of the memory of the present invention, it should also be understood that the invention may be used along with an interleaved concept wherein transfer is made simultaneously into only alternate subsets at a first instant of time and at a second instant of time into the remaining subsets. In this latter embodiment of the invention, fan out circuits D would receive data bits from both the AS and BS storage nodes of the serial input section 10 and the fan in circuit E would transfer data bits into both the AS and BS storage nodes of the serial output section 12.

While the invention has been particularly shown and described with reference to preferred embodiments thereof, it will be understood by those skilled in the art that various changes in form and details may be made therein without departing from the spirit and scope of the invention.

What is claimed is:

1. A serial-parallel-serial charge coupled device memory system comprising
    serial input and output sections each having a charge-carrying channel,
    first and second common charge-carrying channels, and
    first and second adjacent subsets of a main storage section, each of said subsets including a plurality of series registers having charge-carrying channels arranged parallel to each other, each register of said plurality of series registers having an input and an output, a fan out circuit having charge-carrying channels and a common input connected to said serial input section through said first common charge-carrying channel and a plurality of outputs connected to each input of said plurality of series registers and a fan in circuit having charge-carrying channels and a common output connected to said serial output section through said second common charge-carrying channel and a plurality of inputs connected to each output of said plurality of series registers, said serial input and output sections each including storage nodes with a transfer gate interposed between adjacent storage nodes, the common input of said fan out circuit of said first subset being coupled to a first storage node of said serial input section and the common input of said fan out circuit of said second subset being coupled to a second storage node of said serial input section, the common output of said fan in circuit of said first subset being coupled to a first storage node of said serial output section and the common output of said fan in circuit being coupled to a second storage node of said serial output section, said first storage nodes of said serial input and output sections being interconnected by said first subset and said second storage nodes of said serial input and output sections being interconnected by said second subset and a third storage node interposed between said first and second storage nodes in each of said serial input and output sections.

2. A serial-parallel-serial charge coupled device memory system as set forth in claim 1 wherein the fan out circuit of each of said subsets includes three charge-carrying channels arranged between the common input and the input to three registers of said plurality of series registers and the fan in circuit of each of said subsets includes three charge-carrying channels arranged between the output of said three registers and the common output.

3. A serial-parallel-serial charge coupled device memory system as set forth in claim 1 wherein said serial input and output sections further include a two phase clocking system with a first pulse controlling the first and second storage nodes of said serial input section and the third storage node of said serial output section, and a second pulse controlling the first and second storage nodes of said serial output section and the third storage node of said serial input section.

4. A serial-parallel-serial charge coupled device memory system as set forth in claim 1 wherein said serial input and output sections and said main storage section are formed on a semiconductor substrate and wherein said fan out circuit, said fan in circuit and said plurality of series registers each includes storage nodes with a transfer gate interposed between adjacent storage nodes, the storage nodes and transfer gates of said serial input and output sections and of said main storage section include electrodes made of first and second layers of conductive material separated from said substrate by a layer of insulation.

5. A serial-parallel-serial charge coupled device memory system as set forth in claim 4 wherein the electrodes of said storage nodes are made from one layer of said first and second layers of conductive material and the electrodes of said transfer gates are made from the other layer of said first and second layers of conductive material.

6. A serial-parallel-serial charge coupled device memory system as set forth in claim 5 wherein said first and second layers of conductive material are made of polysilicon and said first layer of polysilicon is interposed between said second layer of polysilicon and said layer of insulation and wherein the electrodes of said storage nodes are made of said first layer of polysilicon and the electrodes of said transfer gates are made of said second layer of polysilicon.

7. A serial-parallel-serial charge coupled device memory system as set forth in claim 5 wherein the electrodes of said transfer gates overlap a portion of the electrodes of said storage nodes.

8. A serial-parallel-serial charge coupled device memory system as set forth in claim 7 wherein said serial input and output sections further include a first clock pulse system coupled to the electrodes of the storage nodes and transfer gates of said serial input and output sections and wherein said main storage section further includes a second clock pulse system coupled to the electrodes of the storage nodes and transfer gates of said main storage section.

9. A serial-parallel-serial charge coupled device memory system as set forth in claim 8 wherein said first clock pulse system is a two phase system and said second clock pulse system is an n phase system, where n is greater than two.

* * * * *